United States Patent [19]

Ekin et al.

[11] Patent Number: 5,149,686
[45] Date of Patent: Sep. 22, 1992

[54] HIGH-T SUPERCONDUCTING UNIT HAVING LOW CONTACT SURFACE RESISTIVITY

[75] Inventors: John W. Ekin, Boulder, Colo.; Armand J. Panson; Betty A. Blankenship, both of Pittsburgh, Pa.

[73] Assignee: The United States of America as represented by the Secretary of Commerce, Washington, D.C.

[21] Appl. No.: 598,483

[22] Filed: Oct. 16, 1990

Related U.S. Application Data

[62] Division of Ser. No. 117,259, Nov. 6, 1987, Pat. No. 4,963,523.

[51] Int. Cl.$^5$ ............... C04B 35/00; H01R 4/00; H01B 12/00
[52] U.S. Cl. ............... 505/1; 156/643; 174/94 R; 174/125.1; 204/192.17; 204/192.3; 427/62; 505/706
[58] Field of Search ............... 174/94 R, 125.1; 505/1, 505/706; 204/192.17, 192.3, 192.32; 156/643; 427/62, 63

[56] References Cited

U.S. PATENT DOCUMENTS

| | | | |
|---|---|---|---|
| 3,703,254 | 11/1972 | Maierson et al. | 228/56.3 |
| 3,915,369 | 10/1975 | Schmidt-Brueckan et al. | 228/194 |
| 3,993,411 | 11/1976 | Babcock et al. | 403/404 X |
| 4,056,642 | 11/1977 | Saxena et al. | 427/37 X |
| 4,337,133 | 6/1982 | Augis et al. | 204/192.17 |
| 4,423,430 | 12/1983 | Hasuo et al. | 357/5 |
| 4,544,091 | 10/1985 | Hidler et al. | 228/121 |
| 4,562,121 | 12/1985 | Thiemann et al. | 428/607 |
| 4,660,061 | 4/1987 | Sweeny et al. | 357/5 |
| 4,963,523 | 10/1990 | Ekin et al. | 505/1 |
| 5,015,620 | 5/1991 | Ekin et al. | 505/1 |

OTHER PUBLICATIONS

Nato et al.; *Jap. J. of App. Phys. Letters*, vol. 26, No. 5, May 1987, pp. L802–L803.
Hikita et al., *Jap. J. of App. Phys. Letters*, vol. 26, No. 5, May 1987; pp. L615–L616.
Farrell, D. E. et al.; "Weak Field Magnitization of Superconducting $Y_2Ba_2Cu_3O_x$", Relationship to Microstructure; American Physical Society; Physical Review B1, vol. 35, No. 16; Jun. 1987; pp. 8797–8799.
McCollum R. W. et al.; "Problems in the Production of $YB_a2Cu3Ox$ Superconducting Wire", Advanced Ceramic Materials-Ceramic Superconductors, vol. 2, No. 3B, Jul. 1987; pp. 388–400; Acers, Westerville, Ohio, U.S.
Hayaski; K. et al.; "Preparation and Characterization of Ba-Y-Cu- single crystals"; Japanese Journal of Applied Physics; vol. 26, No. 7, Jul. 87; pp. L1240–L1243; p. L1740, column 2, lines 18–23.
EP-A-O 281474 (Sumitomo) (Abstract, lines 8–12).
Kurisu, M., "Effect of Hydrostatic Pressure on the Superconducting Transition Temperature of $(La_1, -x-B_{ax})_2CuO_{4-y}$ with $X = 0.075$", Journal of Applied Physics, Apr. 1987 pp. L361-362.
Maas, J. Vander et al.; "Improved low contact resistance in high-$T_c$ Y-Ba-Cu-O ceramic superconductors", Nature vol. 32A; Aug. 13, 1987.
Tzeng, Y.; "High performance silver ohmic controls to $YBa_2Cu_3O_{6+x}$ superconductors"; Appl. Phys. Lett. 52(2); Jan. 11, 1988; pp. 155–156.
Orlando, T. P. et al., "Upper Critical Fields and Anistropy Limits of High $T_c$ Superconductor $RE_1Ba_2Cu_3O_{7-y}$ where RE=Nd, Eu, Gd, Dy, Ho, Er, and Tm and $YBa_2Cu_3O_7$-y"; Phys Rev. Lett; May 22, 1987.
Wu, X. D. et al.; "Epitaxial ordering of oxide superconductor thin films on (100) $SrT_1O_3$ prepared by pulsed (List continued on next page.)

*Primary Examiner*—Morris H. Nimmo
*Attorney, Agent, or Firm*—Robert E. Harris; Harold A. Burdick

[57] ABSTRACT

A high-$T_c$ superconducting unit is disclosed having low contact resistivity between a substantially non-degraded surface of the superconductor and a surface of a contact pad in engagement with the substantially non-degraded surface of the superconductor, with contact resistivity of less than 1000 $\mu\Omega$-cm$^2$ at high-$T_c$ superconductor operating temperatures being disclosed.

13 Claims, 1 Drawing Sheet

OTHER PUBLICATIONS laser evaporation", Applied Physics Letters; vol. 51, No. 11; Sep. 14, 1987; (p. 861, column 2, lines 2-4).

EP-A-O 290 331 (Sumitomo) (Abstract; p. 3), lines 58-65; p. 10, lines 51-53.

Maissel et al.; *Handbook of Thin Film Tech;* (McGraw-Hill, N.Y.); c. 1970; pp. 749-752 and 23-12.

Nelson et al.; *Chemistry of High-T Superconductors* (ACS-Aug. 1987) pp. 308-312.

Jin, S. et al.; "Low-resistivity contacts to bulk high $T_c$ superconductors" Appl. Phys. Lett. 54(25); Jun. 19, 1989; pp. 2605-2607.

Ginley, D. S. et al.; "Grain Boundary Superconductivity in the YBa CuO System" Ex Abs High Temperature Superconductors, Proceedings Materials Research Society Spring Meeting; Apr. 23-24 1987; pp. 201-204.

Aoki, Haruyoshi, High-$T_c$ Superconductors $Ba_{0.5}Y_{0.5}CuO_x$-Upper Critical Field and Phases; National Research Institute for Metals, Tokyo; Apr. 25, 1987; Japanese Journal of Applied Physics; May 1987; pp. L711-L713.

Ekin, J. W., "Method for Making low-resistivity contacts to high $T_c$ superconductors" Appl. Pys. Lett. 52(4); Jan. 25, 1988; pp. 331-333.

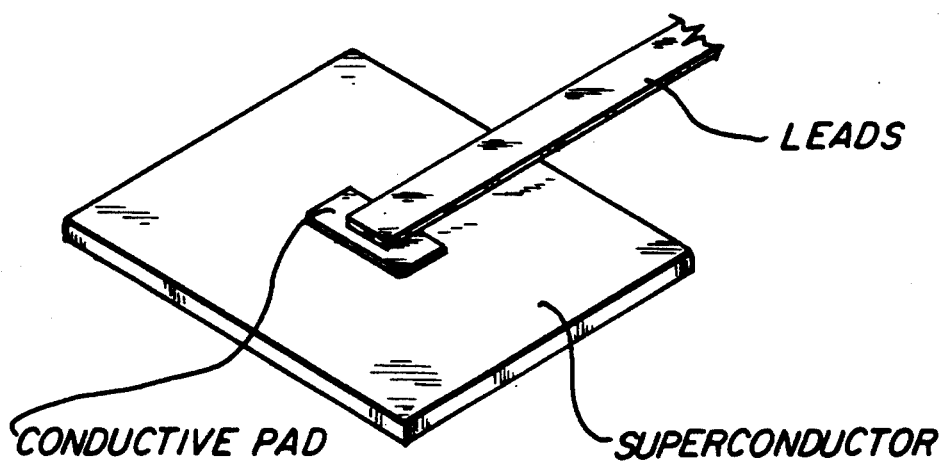

HIGH-$T_c$ SUPERCONDUCTING UNIT HAVING LOW CONTACT SURFACE RESISTIVITY

RELATED APPLICATION

This application is a division of U.S. patent application Ser. No. 07/117,259, filed Nov. 6, 1987 now U.S. Pat. No. 4,963,523.

FIELD OF THE INVENTION

This invention relates to high-$T_c$ superconductors, and, more particularly, relates to a high-$T_c$ superconductor unit having low contact surface resistivity.

BACKGROUND OF THE INVENTION

In superconductors, there is a critical temperature, or $T_c$, at which resistance to the passage of electricity disappears. Conventional superconducting metals, alloys, and compounds have critical temperatures ranging from just above absolute zero to about 15°–20° K. Practical applications for such superconductors are limited because they are operative only at extremely low temperatures.

A new class of superconductors, designated high-$T_c$ superconductors, has recently been discovered and is being extensively investigated. The members of this class have much higher critical temperatures making it possible to use them in devices of commerce. $Y_1Ba_2Cu_3O_7$, for example, has a critical temperature of about 93° K.

In most of their commercial applications, superconductors are, or will be, electrically connected to other components of the device containing them. It is essential that the resistivity of the connections be low, particularly where high currents are to be carried, such as in transmission lines, generators and motors, energy storage devices, and other magnetic applications. Low resistively connections are required for superconductors which are part of an integrated circuit in high density, high speed computers to reduce the heat loads in such computers.

Low resistivity contacts are especially important for high-$T_c$ superconductors, since even moderate resistance-caused heating can raise the temperature of a superconductor enough to significantly lower its critical-current density. Low resistivity contacts are required for high-$T_c$ superconductors in both bulk applications, such as electromagnets, and in thin-film devices, such as computers. Contact resistivity is expressed in terms of surface resistivity $\rho\square=RA$, where R is the contact resistance, and A is the contact area. For small magnet applications at liquid nitrogen temperatures, contact resistivities less than about $10^{-5}\Omega$-$cm^2$ are required to limit heating at the contact to acceptable levels. For circuit board applications, contact resistivities less than about $10^{-4}\Omega$-$cm^2$ are required for the external wire-bond connections to superconducting integrated-circuit chips.

Contacts made with indium solder, silver paint, direct wire bonds and pressure contacts have a contact surface resistivity typically in the range $10^{-2}$ to $10\Omega$-$cm^2$, several orders of magnitude too high for practical applications.

It is known to deposit metals on ceramic components to provide a situs for electrical connections to leads fabricated of copper or other conductive metal. Deposition by sputtering is particularly desirable because the metal deposited strongly adheres to the ceramic substrate. It is known from U.S. Pat. No. 4,337,133 to use sputtered gold as the metal to prepare conductive electrical contact surfaces. It is also known from the paper titled "Metallization of Ceramics For Electronic By Magnetron-Plasmatron Coating" by Schiller et al in Thin Films, 72, 313–326 (1980), that ceramics having silver deposited thereon exhibit good solderability. Various other methods of joining or soldering metals to refractory materials are disclosed in U.S Pat. Nos. 3,915,369 and 3,993,411.

Typical leads for connecting components in an electrical device or system are made of copper wires, silver wires, aluminum wires, gold-plated wires, and the like. However, connecting such components to high-$T_c$ superconductors by conventional means such as soldering using flux-containing solders of the type described in U.S. Pat. No. 3,703,254, or even with indium-based solders, results in a relatively high resistivity connection which can adversely affect desirable properties of the superconductor. High resistivity connections can result even if the superconductor contains a metal contact pad.

SUMMARY OF THE INVENTION

It has been discovered that a low resistivity contact to a high-$T_c$ superconductor is obtained when the contact is made to a non-degraded surface of the superconductor via a metal contact pad using an inert metal. By inert metal is meant a metal that is not readily oxidized such as a noble metal such as gold, platinum, palladium, silver or the like. The contact pad both protects the superconductor surface from exposure to the air as well as providing a situs for attaching external leads. A clean or fresh non-degraded surface is provided by abrading the surface of the superconductor. While abrasion by mechanical means can be utilized, sputter-etching of the superconductor just prior to deposition is preferred. And when combined with sputter deposition, results in a strong bond between the deposited metal and the superconductor.

The present invention provides a unit having low contact resistivity between the surface of high-$T_c$ superconductors and connectors in engagement therewith such as shown in the figure.

More specifically, the present invention provides a superconductor structure having a high-$T_c$ superconductor surface engaging contact unit with a surface resistivity lower than heretofore achieved, with resistivities of less than $10^{-5}\Omega$-$cm^2$ having been achieved.

The present invention also provides a unit having low contact resistivity between a non-degraded high-$T_c$ superconductor surface and an inert metal contact pad.

The lead or leads to be connected to the superconductor are soldered to the contact pad or pads by soldering or by thermosonic bonding techniques. A low-melting solder such as indium (melting point 156° C.) or In-2 wt % Ag (melting point 150° C.) is preferred. The solder utilized should be flux-free or contain only a very small amount of flux.

Using the foregoing, contacts have been made which consistently have surface resistivities $\rho\square$ of about $10^{-5}\Omega$-$cm^2$. This is several thousand times less than the resistivities obtained using conventional indium-solder or silver-paint and silver epoxy contacts. Also, contacts according to the present invention are capable of carrying current loads of several hundred amperes without apparent degradation, whereas silver paint and silver epoxy contacts burn out at about 0.1 A/mm. In addition, the present contacts do not degrade when exposed to dry air for a period of at least four months. The contact process is carried out at relatively low temperatures and therefore avoids possible degradation of the underlying superconductor, as well as allowing post-reaction shaping and processing steps before the contacts are applied.

A connection can be made without first forming a metal contact paid on the surface of the superconductor. However, the resistivity of the connection will be many hundred times greater than if a contact pad was present.

BRIEF DESCRIPTION OF DRAWINGS

The drawing shows the superconductor with a conductive pad attached to its surface and a conductive lead attached to the pad.

DESCRIPTION OF THE INVENTION

High-$T_c$ superconductors are usually prepared by a procedure which involves firing in an atmosphere of oxygen, as described by Panson et al, Phys. Rev. B35, 8774 (1987). In one embodiment, a unit of the present invention can be prepared without removing the just formed high-$T_c$ superconductor from the oxygen atmosphere of the firing oven in which it has been formed. Without limiting the invention to any theoretical method of operation, it is believed that exposure of a high-$T_c$ superconductor to the atmosphere, i.e., air containing water vapor and carbon dioxide, causes a reaction to take place at the surface of the superconductor which results in an increase in the resistivity of any electrical contact or connection subsequently formed. However, low-resistivity contacts acceptable for many purposes can be prepared if the degraded surface layer is removed or if it is kept from forming in the first place by eliminating exposure of the surface to air.

The metallic contact pad on the high-$T_c$ superconductor is made with an inert metal by depositing or sputtering a thin layer of the metal onto a predetermined portion or portions of the surface of the superconductor. Sputtering is particularly effective in forming a low resistivity contact, because the surface can be sputter etched to remove the degraded surface layer before sputter depositing the contact pad. Also, the sputter deposition process generally results in superior adhesion.

Silver and gold are particularly preferred as contact pad materials since both are inert with strongly positive standard reduction potentials. Silver has the added advantage that its oxides dissociate at a fairly low temperature, and its oxygen diffusion coefficient is fairly high, which allows oxygen permeability at moderate temperatures.

The leads are connected to the contact pad, preferably by soldering with a low melting solder such as indium or a low melting indium alloy, or by thermosonic bonding techniques. To form a low resistivity connection by soldering, low temperatures and minimum heating times should be utilized.

To avoid the need to abrade the surface of the superconductor or to minimize the amount of abrading required, it is necessary that the metal contact pad be formed on the high-$T_c$ superconductor as rapidly as possible after the superconductor has been prepared by firing or the surface of the superconductor must be protected from degradation by storage in an inert medium such as an inert fluorocarbon or in a pure oxygen atmosphere free of water vapor and carbon dioxide. Storage in a conventional laboratory desiccator is not sufficient.

A systematic investigation of indium solder contact samples showed that longer air exposure time between firing in oxygen and making the contacts correlated with a contact resistivity increase and non-ohmic behavior. As the air exposure time in a desiccator was decreased from 38 days to 9 days, the $\rho\square$ decreased from $5.5\times10^{-2}\Omega\text{-cm}^2$ to $1.5\times10^{-2}\Omega\text{-cm}^2$. Removal of the degraded surface layer by mechanical abrasion resulted in a resistivity decrease to $3.6\times10^{-3}\Omega\text{-cm}^2$ and more nearly ohmic behavior. The best indium contacts were made by using eutectic In-2%Ag solder (without soldering flux), and mechanically abrading the surface under the molten solder with either the tip of the soldering iron or with an ultrasonic soldering iron. Surface degradation occurs within a very short time scale, since polishing the superconductor surface several seconds before applying the indium solder did not result in a comparable decrease in contact resistivity. These early contact results also showed that, chemically, indium was not a good candidate material for making contacts. The resistivity of the contact typically increased more than 50% several days after making the contact.

The indium contacts were semiconducting in character; the resistivity increase about 3 to 7 times as the temperature was lowered from 295° K. to 76° K. The contacts were also non-ohmic, with the resistivity decreasing as current was increased. Contacts prepared using the preferred method were metallic in character, with resistivity decreasing 3 to 12 times on cooling fro 295° K. to 76° K. (see second last column in Table I).

Our invention is further illustrated by means of the following non-limiting examples:

Conventionally prepared bulk-sintered samples of $Y_1Ba_2Cu_3O_7$ were used as the high-$T_c$ superconductor. After firing had been completed, the superconductor was cooled in oxygen, cut into bars 3.2 mm wide by 12 mm long and placed in a sputter vacuum chamber. Total exposure time of the $Y_1Ba_2Cu_3O_7$ to air was about 0.8 hour in Examples 1, 2, 4, 5 and 6 and 2.0 hours in Example 3.

The sputter system utilized for deposit of the metal contact pad was pumped down overnight to a base pressure of about 70$\mu$ Pa. The superconductor surface was sputter etched to a depth of 200 to 500 Å in a 3 Pa pressure of argon at 1.25 kV rms. A 1 to 6 $\mu$m thick contact pad was then sputtered onto the $Y_1Ba_2Cu_3O_7$ surface over a 15 to 30 minute period in an argon atmosphere with 4.2 kV rms on the sputter target and no applied bias. The $Y_1Ba_2Cu_3O_7$ sample was held at temperatures less than 100° C. by a water cooled sample holder.

External connections were made to the sputtered silver contact pads in two different ways, first by soldering copper wires to the silver pads as would be appropriate for magnet and other bulk applications (Examples 1 and 3) and by ribbon-bonding fine gold leads appropriate for integrated circuit applications (Examples 2, 4, 5 and 6).

In Examples 1 and 3, the silver pad was indium coated with In-2% Ag solder without the use of a flux. Two wires were soldered to the contact pad, one to carry current and the other to detect voltage at the surface of the pad.

In Examples 2, 4, 5, and 6, fine gold current and voltage leads about 8 μm×80 μm were attached using a thermosonic ribbon bonder to the contact pad. The temperature of the silver pad was elevated to about 100° C. (higher temperatures, e.g., 150°–200°, could be utilized).

The resistivities of the contacts made by the procedures of Examples 1–6 are summarized in Table I. Data for these samples were obtained using a four terminal technique (to eliminate the large lead-resistance correction that otherwise would have to be applied) with one voltage tap indium soldered directly to the superconductor close to the current pad. Two wires were attached to the current pad, one to carry current, the other to detect voltage at the surface of the pad. The other voltage tap was soldered directly to the superconductor close to the contact pad using indium solder (low contact resistivity was not needed for the voltage detection leads). The room temperature value of the contact resistivity was corrected, where necessary, for the short length of normal $Y_1Ba_2Cu_3O_{7-\delta}$ material between the contact pad and the voltage tap on the superconductor by measuring the resistivity per unit length of superconductor using another voltage tap attached to the superconductor. Accuracy of the contact resistivity measurement was about ±10%.

contacts made with samples exposed to air for about only an hour. Additional sputter etching prior to deposition of the inert metal appears required in those cases where the superconductor has been exposed to air for an extended period of time.

The low resistivity values shown in Table I were unchanged when the role of the current and voltage leads were reversed. With current introduced into the voltage lead and voltage detected using the current lead, the contact resistivities were the same to within 1%. The contact resistivity remained the same for both current directions. Also there was no measurable increase in resistivity with time as current flowed through the contact.

Unlike conventional indium contacts which were semiconducting in character, increasing as the temperature was lowered, the resistivity of the contacts of the present invention were metallic in character, decreasing in resistivity 4 to 12 times on cooling from 295° K. to 76° K. (see the second last column in Table I).

Contacts made using the method as described herein, unlike conventional indium solder contacts, showed negligible degradation over several months. The contact pads appear to protect the surface of the superconductor from deterioration due to exposure to air. The contact of Example 6, for example, maintained its

TABLE I

| | Contact Pad Pad* | External Lead Connection | Contact Pad Area, Ac in mm² | Contact resistance R at 295K in mΩ | Contact resistance R at 76K in mΩ | Resistance ratio R (76K)/ R(295K) | Surface Resistivity (ρ□) R(76K) × Ac (μΩ-cm²) |
|---|---|---|---|---|---|---|---|
| 1 | 5.9 μm Au | In-2% Ag solder | 31 | 1.4 | 0.60 | 0.43 | 180 |
| 2 | 5.9 μm Au | Au ribbon bond | 0.21 | 39 | 14 | 0.36 | 29 |
| 3 | 1.4 μm Ag | In-2% Ag solder | 14 | 5.5 | 0.44 | 0.08 | 62 |
| 4 | 2.5 μm Ag | Au ribbon bond | 0.07 | 87 | 19 | 0.22 | 13 |
| 5 | 2.5 μm Ag | Au ribbon bond | 0.17 | 30 | 7.9 | 0.26 | 13 |
| 6 | 2.5 μm Ag | Au ribbon bond | 0.06 | 59 | 15 | 0.32 | 9 |

*made by sputter deposition of the indicated inert metal after sputter etching

As shown in the last column of Table I, the lowest contact resistivities were obtained with silver contact pads and wire bonded leads. The contact resistivities for these contacts (Examples 4, 5 and 6 in Table I) were consistently and reproducibly on the order of $10^{-5}$ Ω-cm², or about three to four orders of magnitude lower than conventional contacts made from indium, silver paint, or pressure contacts. Contacts with soldered wire leads (Examples 1 and 3) had a resistivity that was several times larger than the contacts with wire-bonded leads, but still several orders of magnitude lower than the earlier contact. When gold was used for the contact pad (Examples 1 and 2), the contact resistivities were somewhat higher than for silver. This may have resulted from a better bonding of the silver with the $Y_1Ba_2Cu_3O_7$ surface. Contacts with soldered wire leads (Examples 2, 4, 5 and 6) had resistivities that were several times larger than the contacts with wire-bonded leads, but still several orders of magnitude lower than earlier contacts. Alloying of the solder with the noble metal pad may have slightly degraded the contact interface.

When the procedure of the examples was employed with samples exposed to air for about nine weeks, resistivity was about an order of magnitude higher than low resistivity after being stored in dry air for over four months.

A number of contacts of the present invention have been made with reproductible results. Stability of the contacts with time and use also appears to be excellent. The contacts made thus far have ranged in the area from 0.1 to 10 square millimeters, but there is no inherent size limitation and much larger or smaller contact areas can be utilized. The contacts potentially can be photolithographically configured. The contacts showed consistently low resistivity and little degradation when exposed to dry air over a four-month period when repeatedly cycled between room temperature and 76° K.

The units described herein can be made by modifying the methods set forth above, and such units will also have low contact resistivities. Glow-discharge cleaning and evaporative deposition of noble metals can yield low resistivity contacts, although sputter deposition generally results in superior adhesion.

The present invention is applicable to bulk samples, to thin films, and to single crystals of $Y_1Ba_2Cu_3O_x$. It is also applicable to $La_{1.85}Sr_{0.15}CuO_4$ as well as to other metal oxide high-$T_c$ superconductors.

A key aspect to the present invention is attaching the contact to a non-degraded surface of the high-$T_c$ superconductor. Such a surface can be achieved by abrading off the degraded surface layer of a superconductor exposed to air. An alternate approach is to make the contact pad immediately after the ceramic superconductor has been fired or to protect the surface of the superconductor from an exposure to air, or by sealing it in an oxygen atmosphere or an inert atmosphere free from water vapor and carbon dioxide. Or the freshly prepared ceramic may be encased or sealed with a gas-impermeable coating fabricated of a resin which is non-reactive with the ceramic and which can be removed, for example, by sputter-etching.

From the foregoing, it should be realized that this invention provides a high-$T_c$ superconductor unit having improved low contact resistivity between the surface of the superconductor and a connector in engagement therewith.

What is claimed is:

1. A superconducting unit, comprising:
   a superconductor formed from high-$T_c$ superconducting material and having at least one surface in a substantially non-degraded state;
   an electrically conductive pad formed from an metal inert from oxidation with said pad having first and second surface portions, said first surface portion being in contact with said substantially non-degraded superconductor surface so that a low contact resistivity exists between the contact pad and the superconductor; and
   electrically conductive means connected with said second surface portion of said pad to enable transmission of electric current at high current densities between said superconducting unit and a second unit through said electrically conductive means and said electrically conductive pad.

2. The superconducting unit of claim 1 wherein said first surface portion of said electrically conductive pad and said substantially non-degraded superconductor surface in contact therewith have a contact resistivity of less than about 1000 $\mu\Omega$-$cm^2$ at high-$T_c$ superconductor operating temperatures.

3. The superconducting unit of claim 1 wherein said contact resistivity between said substantially non-degraded superconductor surface and said first surface portion of said electrically conductive pad is less than about 200 $\mu\Omega$-$cm^2$.

4. The superconducting unit of claim 1 wherein said superconducting material is a metal oxide superconductor.

5. The superconducting unit of claim 4 wherein said metal oxide superconductor is $Y_1Ba_2Cu_3O_x$.

6. The superconducting unit of claim 1 wherein said substantially non-degraded surface of said superconductor is an abraded or etched surface.

7. The superconducting unit of claim 1 wherein said first surface portion of said electrically conductive pad adheres to said substantially non-degraded surface of said superconductor due to sputter or evaporative deposition of said electrically conductive pad onto said surface of said superconductor.

8. The superconducting unit of claim 1 wherein said electrically conductive means is connected with said second surface portion of said pad to enable transmission of electric current at high current loads.

9. The connector unit of claim 1 wherein said metal inert from oxidation is a noble metal.

10. The connector unit of claim 9 wherein said noble metal is one of gold and silver.

11. The connector unit of claim 1 wherein said electrically conductive means includes at least one electrical lead connected with said second surface portion of said pad.

12. The connector unit of claim 11 wherein said electrical lead is connected to said metal inert from oxidation by soldering or by thermosonic bonding.

13. The connector unit of claim 12 wherein said electrical lead is connected to said metal inert from oxidation by soldering with indium or a low melting temperature indium alloy.

* * * * *